United States Patent
Morrison (10) Patent No.: US 7,709,915 B2
(45) Date of Patent: May 4, 2010

(54) MICROELECTRONIC DEVICES HAVING AN EMI SHIELD AND ASSOCIATED SYSTEMS AND METHODS

(75) Inventor: Michael W. Morrison, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/116,788

(22) Filed: May 7, 2008

(65) Prior Publication Data

US 2009/0278219 A1    Nov. 12, 2009

(51) Int. Cl.
  *H01L 21/00* (2006.01)
  *H01L 31/00* (2006.01)

(52) U.S. Cl. .............. 257/432; 257/E21.002; 438/65

(58) Field of Classification Search ........ 257/432, 257/659, 508, 660, 698, E31.097, E21.002; 438/107, 118, 667, 65; 361/800, 600, 679.01, 361/816; 29/832, 841; 348/340
See application file for complete search history.

(56) References Cited

U.S. PATENT DOCUMENTS

| | | | |
|---|---|---|---|
| 5,639,989 A | 6/1997 | Higgins, III | |
| 6,114,187 A | 9/2000 | Hayes | |
| 6,534,859 B1 | 3/2003 | Shim et al. | |
| 6,601,293 B1 | 8/2003 | Glenn | |
| 6,614,102 B1 | 9/2003 | Hoffman et al. | |
| 6,865,804 B2 * | 3/2005 | Youker et al. | 29/846 |
| 6,936,914 B2 | 8/2005 | Shinomiya et al. | |
| 7,295,029 B2 | 11/2007 | Zhao | |
| 2001/0008301 A1* | 7/2001 | Terui | 257/659 |
| 2002/0006687 A1* | 1/2002 | Lam | 438/118 |
| 2005/0184219 A1* | 8/2005 | Kirby | 250/208.1 |
| 2005/0186705 A1* | 8/2005 | Jackson et al. | 438/106 |
| 2006/0216857 A1 | 9/2006 | Zhao | |
| 2006/0221591 A1 | 10/2006 | Kong | |
| 2008/0191300 A1* | 8/2008 | Nystrom et al. | 257/432 |

* cited by examiner

*Primary Examiner*—Thomas L Dickey
*Assistant Examiner*—Nikolay Yushin
(74) *Attorney, Agent, or Firm*—Kramer Levin Naftalis & Frankel LLP (57) ABSTRACT

Microelectronic devices having an EMI shield, systems including such microelectronic devices, and methods for manufacturing such microelectronic devices. One embodiment of a microelectronic device comprises an imaging system comprising a microelectronic die, an optics assembly, and an electromagnetic interference (EMI) shield. The microelectronic die includes an image sensor, processing components electrically coupled to the image sensor, a first interconnect electrically isolated from the processing components, and a second interconnect electrically coupled to the processing components. The optics assembly is aligned with the image sensor, and the electromagnetic interference (EMI) shield is between the optics assembly and the processing components. The EMI shield is electrically coupled to the first interconnect.

22 Claims, 10 Drawing Sheets

MICROELECTRONIC DEVICES HAVING AN EMI SHIELD AND ASSOCIATED SYSTEMS AND METHODS

TECHNICAL FIELD

The present disclosure is related to microelectronic devices having an electromagnetic interference (EMI) shield and methods of manufacturing such microelectronic devices.

BACKGROUND

Microelectronic devices include processors, memory devices, RF devices, imagers and many other types of products. Microelectronic imagers are a growing sector of microelectronic devices used in digital cameras, wireless devices with picture capabilities, and many other applications. Cell phones and personal digital assistants (PDAs), for example, are incorporating microelectronic imagers for capturing and sending pictures. The growth rate of microelectronic imagers has been steadily increasing as the imagers become smaller and produce better images with higher pixel counts.

Microelectronic imagers include image sensors that use charged coupled device (CCD) systems, complementary metal-oxide semiconductor (CMOS) systems, or other solid-state systems. CCD image sensors have been widely used in digital cameras and other applications. CMOS image sensors are also very popular because they have low production costs, high yields, and small sizes. CMOS image sensors can provide these advantages because they are manufactured using technology and equipment developed for fabricating semiconductor devices. CMOS image sensors, as well as CCD image sensors, generally include an array of pixels arranged in a focal plane. Each pixel is a light-sensitive element that includes a photogate, a photoconductor, or a photodiode with a doped region for accumulating a photo-generated charge.

One problem with current microelectronic imagers is that they are sensitive to background electromagnetic radiation. Background radiation can indirectly influence the amount of charge stored at individual pixels by altering the amount of thermally emitted charges or "dark current" within the substrate material carrying the image sensor. This can affect the output from individual sensors in a manner that causes distortion of the image or a blackout of individual pixels. To overcome this problem, microelectronic imaging systems have incorporated EMI suppressing structures.

Figure 1:
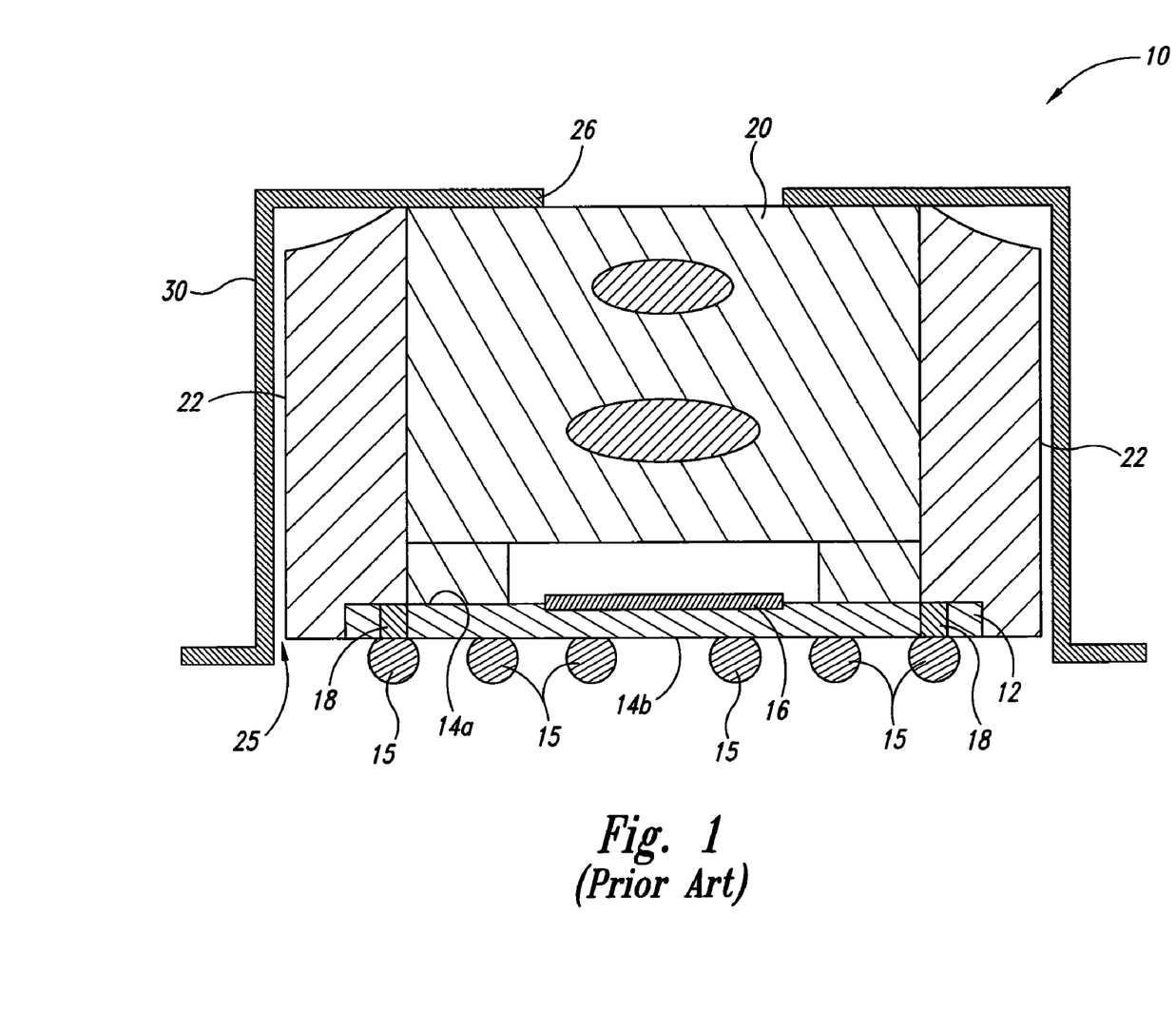
FIG. 1 is a schematic cross-sectional view of an imaging system having an EMI shield in accordance with the prior art.

FIG. 1, for example, illustrates an existing imager assembly 10 having an EMI suppressing structure in accordance with the prior art. As shown in FIG. 1, the imager assembly 10 includes an imager die 12, an objective lens 20 attached to a first surface 14a of the imager die 12, a plurality of solder balls 15 attached to a second surface 14b of the imager die 12, and an encapsulant 22 encasing the objective lens 20 and the imager die 12. The imager die 12 typically includes a sensor array 16 (e.g., a CMOS or CCD sensor array) at the first surface 14a and a plurality of interconnects 18 extending between the first and second surfaces 14a-b to electrically connect the sensor array 16 and/or other internal circuitry (not shown) of the imager die 12 to the solder balls 15. As shown in FIG. 1, an existing EMI suppressing structure 30 includes a metal housing that has a cavity 25 in which the encapsulated imager die 102 and the objective lens 20 are positioned and an opening 26 aligned with the objective lens 20.

One drawback of the existing imager assembly 10 is that the EMI suppressing structure 30 is large and increases the footprint of the imager assembly 10. As shown in FIG. 1, the metal housing is larger than the imager die 12. Such a large footprint, however, is undesirable because cell phones, cameras, and other portable devices require smaller and smaller components.

BRIEF DESCRIPTION OF THE DRAWINGS

The following drawings, which are not necessarily to scale, depict various embodiments of the disclosure and are not intended to limit the scope of the disclosure. Like reference numbers and symbols refer to like components throughout the figures.

DETAILED DESCRIPTION

Various embodiments of microelectronic devices that include EMI shields are described below. Although the following embodiments describe and show EMI shields in the context of imaging systems and imagers, several embodiments of the EMI shields can be used in other microelectronic devices (e.g., memory devices, processes, sensors, etc.). Embodiments of EMI shields can include a variety of conductive materials for inhibiting the transmission of electromagnetic radiation to and/or from imaging dies or other types of microelectronic dies. Suitable imaging dies can include CMOS image sensors as well as CCD image sensors or other solid-state imaging devices. Several details describing structures or processes associated with imaging systems, units, and dies and their corresponding methods of fabrication have not been shown or described in detail to avoid unnecessarily obscuring the description of the various embodiments. Other embodiments of microelectronic devices, imaging systems, units, and dies in addition to or in lieu of the embodiments described in this section may have several additional features or may not include many of the features shown and described below with reference to FIGS. 2A-6.

Figure 2A:
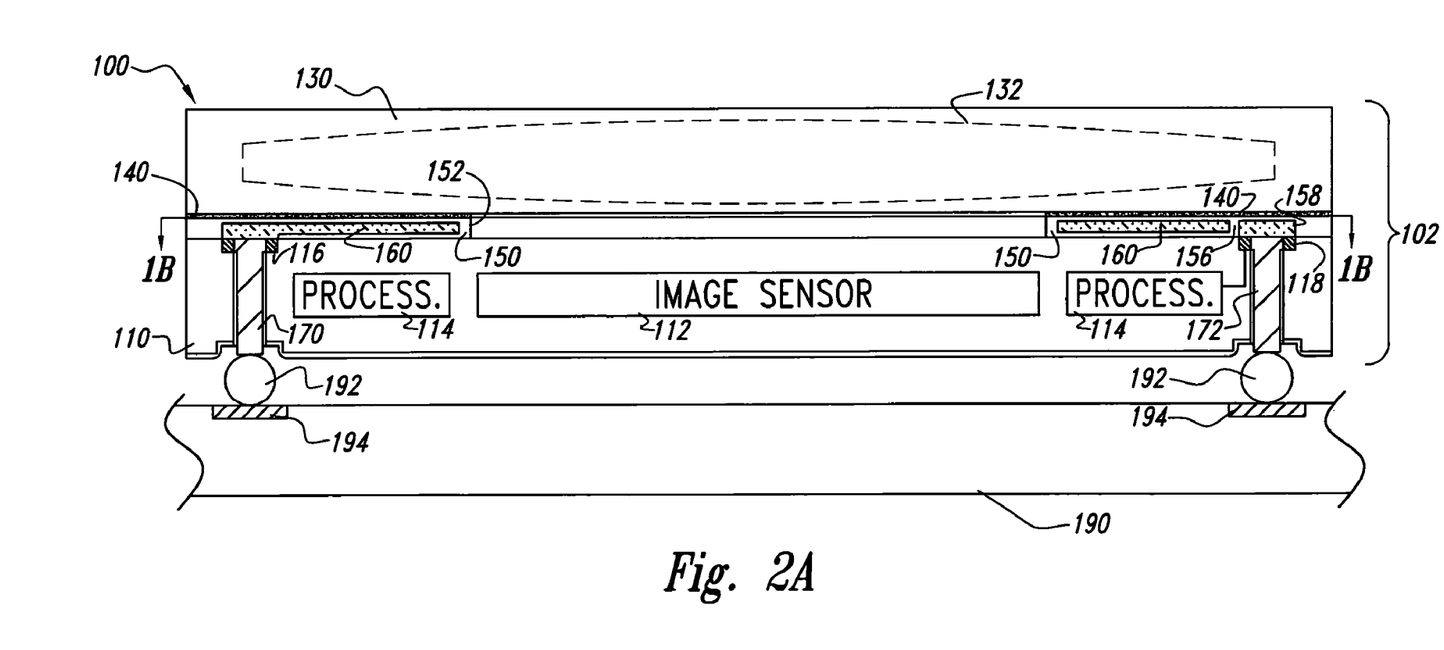
FIG. 2A is a cross-sectional side view schematically illustrating an imaging system having an imaging unit with an EMI shield configured in accordance with an embodiment of the disclosure.

FIG. 2A is a cross-sectional side view schematically illustrating an embodiment of an imaging system 100. In this embodiment, the system 100 includes an imaging unit 102 having a microelectronic imaging die 110, a optics assembly 130, and an adhesive layer 140 attaching the optics assembly 130 to the die 110. The die 110 can include an image sensor 112, processing components 114, and a redistribution structure 150 having an opening 152. The image sensor 112 can be configured to receive optical, infrared and/or other types of electromagnetic radiation that passes through the optics assembly 130 and the opening 152. The processing components 114 are generally integrated circuitry formed in the die 110 and configured to control the image sensor 112 and/or process imaging signals produced by the image sensor 112. For example, in several embodiments, the processing components 114 read individual sensor pixels (not shown) of the image sensor 112 and produce a digital output for the individual sensor pixels. The die 110 can further include one or more first substrate pads 116 and a plurality of second substrate pads 118. As explained in more detail below, the first substrate pad 116 can be electrically coupled to EMI shielding and the second substrate pads 118 can be electrically coupled to the processing components 114.

The optics assembly 130 is shown schematically in FIG. 2A and can include a cover plate (not shown) over the image sensor 112, filters (not shown), and one or more objective lenses 132. The optics assembly 130 can be attached to a spacer (not shown) or other device that positions the optics apart from the image sensor 112 by a desired distance to focus the radiation at the image sensor 112. The objective lenses 132 can be constructed from glass, polymers, a combination of glass and polymers, and/or other suitable materials that can transmit the desired radiation.

In the embodiment shown in FIG. 2A, the redistribution structure 150 includes an EMI shield 160 for use with imagers or other microelectronic devices. In this embodiment, the EMI shield 160 is positioned between the die 110 and the optics assembly 130 such that the EMI shield 160 protects the processing components 114 from electromagnetic radiation. The EMI shield 160, for example, can be configured to block the radiation that passes through the optics assembly 130 from reaching the processing components 114. In one application, the imaging unit 102 can be incorporated into a cell phone and the EMI shield 160 can also protect the processing components 114 from electromagnetic fields produced by one or more circuit components of the cell phone. In these and other embodiments, the EMI shield 160 can also attenuate electromagnetic fields produced by the processing components 114. For example, the EMI shield 160 can attenuate electromagnetic fields generated by the processing components 114 that could affect the operation of other circuit components contained in a cell phone or other application.

Several embodiments of die 110 can further include a first through-die interconnect 170 that extends through the die 110 and is electrically coupled to the EMI shield 160 via the first substrate pad 116. The first through-die interconnect 170 can extend completely through the die 110 so that one end of the first through-die interconnect 170 is exposed at the backside of the die 110. The exposed portion of the first through-die interconnect 170 can be coupled to an electrical connector for conducting current to/from the EMI shield 160. For example, several embodiments of the system 100 further include an interposer substrate 190, such as a printed circuit board, that carries the imager unit 102 and is electrically coupled to the first through-die interconnect 170. An individual bump bond 192 or other electrical connector can electrically connect the first through-die interconnect 170 with an individual substrate pad 194 of the interposer substrate 190. Accordingly, the interposer substrate 190 can use the first through-die interconnect 170 to transmit and/or receive a ground potential or another electrical signal to/from the EMI shield 160.

Referring still to FIG. 2A, the die 110 can further include second through-die interconnects 172 electrically coupled to the processing components 114 via the second substrate pads 118 (only one second through-die interconnect and one second substrate pad are shown in FIG. 2A). The second through-die interconnects 172 can be electrically coupled to individual substrate pads 194 of the interposer substrate 190 via individual bump bonds 192. However, unlike the first through-die interconnect 170, the second through-die interconnects 172 are electrically insulated from the EMI shield 160. In one embodiment, the redistribution structure 150 includes dielectric spacers 156 that electrically isolate the second through-die interconnects 172 from the EMI shield 160. Accordingly, the interposer substrate 190 does not transmit electrical signals to the EMI shield 160 when communicating with the processing components 114 and/or the image sensor 112.

Figure 2B:
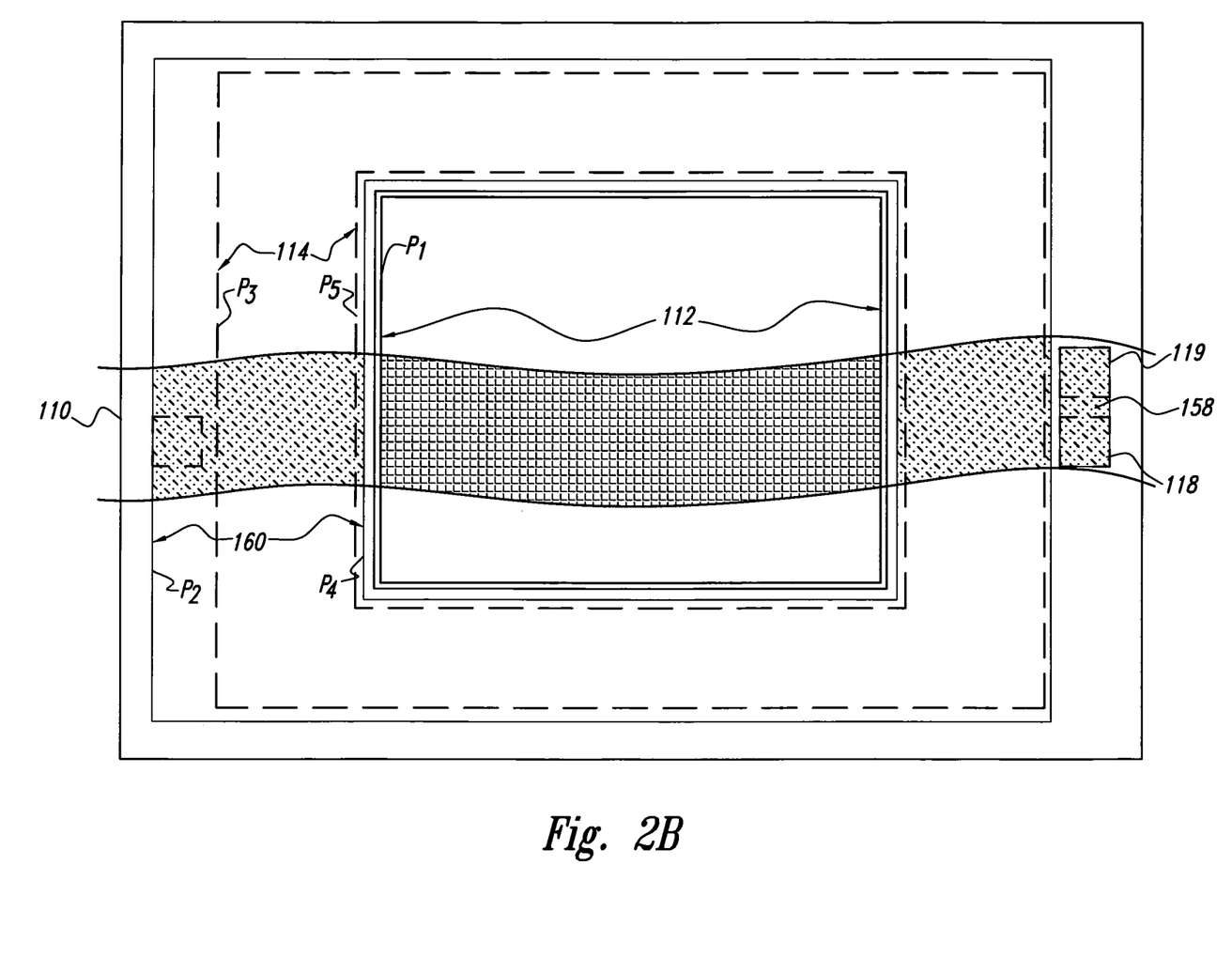
FIG. 2B is a partial top-plan view schematically showing a microelectronic die of the imaging unit of FIG. 2A.

FIG. 2B is a partial top-plan view of the die 102 schematically showing the image sensor 112, the processing components 114 (drawn in phantom), and the EMI shield 160. The processing components 114 generally surround an outer perimeter $P_1$ of the image sensor 112, and the EMI shield 160 can be superimposed with the processing components 114, but the EMI shield 160 does not obstruct the image sensor 112. The EMI shield 160, for example, can have an outer perimeter $P_2$ positioned outside of an outer perimeter $P_3$ of the processing components 114, and the EMI shield 160 can have an inner perimeter $P_4$ that is positioned inside of an inner perimeter $P_5$ of the processing components 114. In many embodiments, the EMI shield 160 can have other configurations, but it generally retains inner and outer perimeters $P_4$ and $P_2$ that are aligned with and/or extend beyond the inner and outer perimeters $P_5$ and $P_3$ of the processing components 114.

In many embodiments, the redistribution structure 150 can also include metal traces 158 (only one is shown in FIG. 2B) that electrically couple the substrate pads 118 with other substrate pads or other components of the die 102. The EMI shield 160 and the traces 158 can be electrically separate portions of the same metal layer in the redistribution structure 150. For example, the EMI shield 160 can be a first portion of a metal layer and the traces 158 can be a second portion of the same metal layer. In the specific embodiment shown in FIG. 2B, one of the traces 158 of the redistribution structure electrically connects one of the second substrate pads 118 with another substrate pad 119 (both drawn in phantom).

In contrast to the imaging system 100, conventional imaging systems do not have an EMI shield within the footprint of the imaging unit. As shown in FIG. 1, conventional imaging units generally include a metal can that surrounds the encapsulated die and extends well beyond the edges of the die. Consequently, conventional imaging units with EMI shields have a large footprint. Several embodiments of the system 100, however, have an EMI shield integrated into the redistribution structure 150 that is not larger than the footprint of the die 110. As a result, the system 100 is more compact and less expensive to manufacture than conventional imaging units employing the EMI shielding shown in FIG. 1.

Figure 2C:
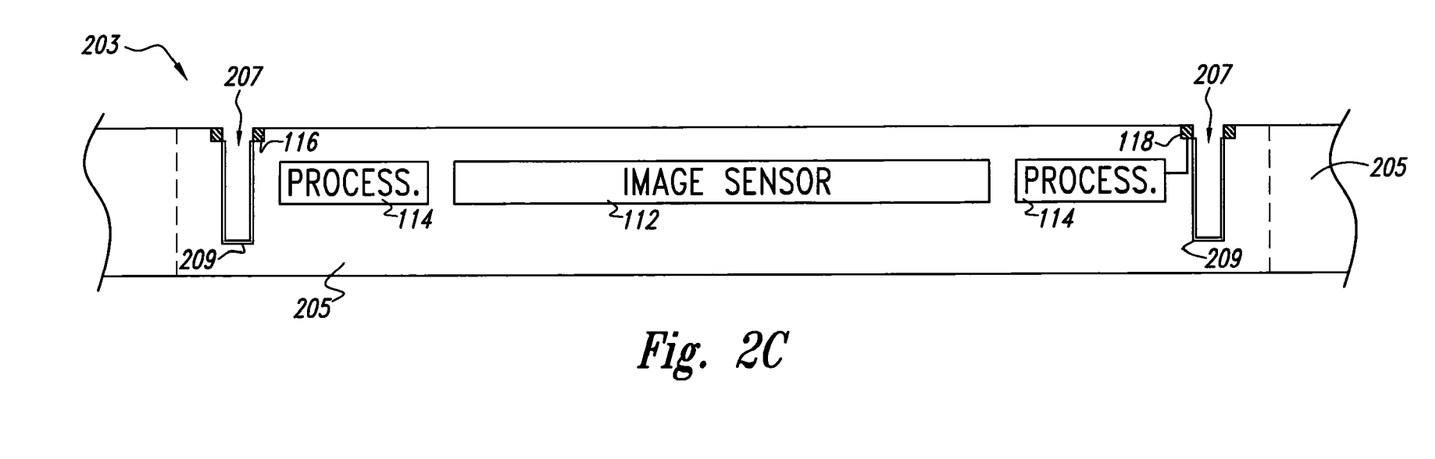
FIGS. 2C-2H are cross-sectional side views schematically illustrating stages of methods for forming the imaging units of FIGS. 2A and 2B in accordance with several embodiments of the disclosure.

FIGS. 2C-H illustrate stages of methods for forming embodiments of imaging units shown in FIG. 2A. FIG. 2C is a cross-sectional side view of a microelectronic workpiece 203 (e.g., a semiconductor substrate or microelectronic wafer) at a stage of forming an embodiment of the die 110 (FIGS. 2A and 2B). The workpiece 203 includes a substrate 205, the image sensor 112, and the processing components 114. The substrate 205 can have a front side surface and a backside surface. The image sensor 112 and processing components 114 are generally formed in and/or on the substrate 205 so that the image sensor can receive radiation at the front side surface of the substrate 205 as known in the art. At this stage of the process, a plurality of holes 207 are formed in the workpiece 203 to extend at least partially through the substrate 205. The holes 207 can be formed so that they are aligned with the first substrate pad 116 and the second substrate pads 118. In many embodiments, the holes 207 can be formed through the first and second substrate pads 116 and 118 using single- or multi-step wet/dry etching techniques and/or laser drilling/ablation methods. A plurality of dielectric liners 209 are then formed in the holes 207. The dielectric liners 209 can be formed by globally depositing a thin dielectric layer on the workpiece 203 and subsequently removing portions of the global dielectric layer that are not located within the holes 207. In many embodiments, the dielectric liners 209 include a nonconductive material that can be deposited at low temperatures, such as materials that can be deposited using chemical vapor and/or physical vapor deposition (CVD and/or PVD) processes. The selected portions of the global dielectric layer can be removed using a spacer etch or other suitable etching process.

Figure 2D:
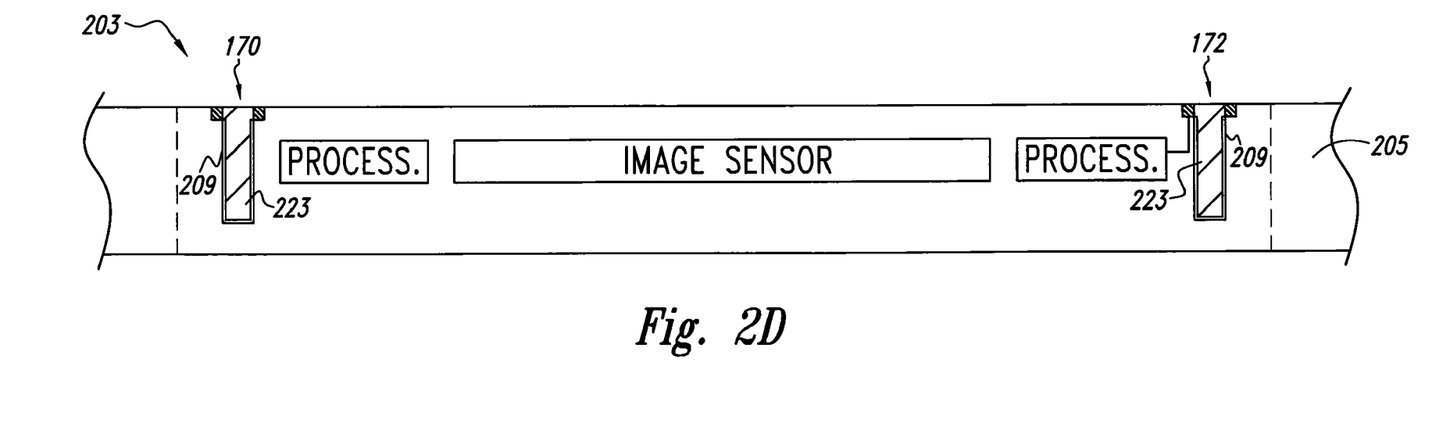

FIG. 2D is a cross-sectional side view of the workpiece 203 at a subsequent stage after the first through-die interconnect 170 and the second through-die interconnects 172 have been formed. The through-die interconnects 170 and 172 can be formed by depositing a seed layer (not shown) on the surfaces of the dielectric liner 209 within the holes 207 (FIG. 2C) and then plating a conductive material 223 having one or more individual metal layers onto the seed layer. For example, the seed layer can be a conductive material, such as copper, and an electrical potential can be applied to the seed layer to electroplate the conductive material 223 into the holes 207. In other embodiments, however, the conductive material 223 can be plated electrolessly into the holes 207. Also, although the through-die interconnects 170 and 172 are shown as being solid, in other examples the through-die interconnects 170 and 172 may have a hollow center. For example, the interconnects 170 and 172 can include an opening extending through the center of the conductive material 223. In many embodiments, the conductive material 223 can include copper, gold, nickel, and/or palladium.

Figure 2E:
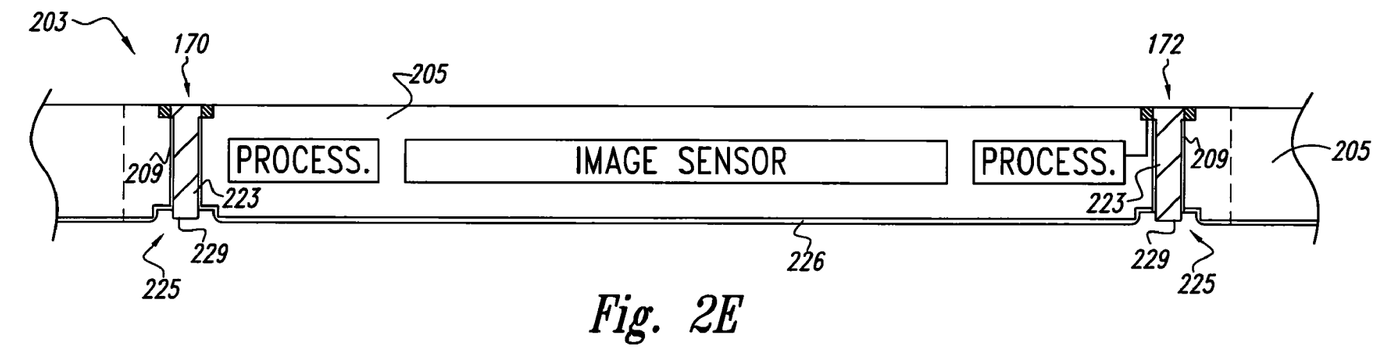

FIG. 2E is a cross-sectional side view of the workpiece 203 at a subsequent stage after (a) the substrate 205 has been thinned, (b) recesses 225 have been formed at the backside surface of the substrate 205, and (c) a backside dielectric layer 226 has been deposited over the backside surface of the substrate. The substrate 205 can be thinned using a chemical etch, backgrinding, or a chemical-mechanical polishing process, and the recesses 225 can be formed using a separate wet/dry etch process such that the recesses 225 expose backside portions 229 of the interconnects 170 and 172. The recesses 225 can be trenches etched into the backside surface after thinning the substrate 205, or the recesses 225 can be individual, discrete depressions around each through-die interconnect 170 and 172. The backside dielectric layer 226 can then be deposited onto the backside surface of the substrate 205 after forming the recesses 225. The backside dielectric layer 226, for example, can be spun on such that the backside dielectric layer 226 partially fills the recesses 225 but does not completely cover the individual backside portions 229 of the interconnects 170 and 172. In several embodiments, the backside portions 229 of the interconnects 170 and 172 can also be coated with an under-bump metallization (UBM) layer (not shown) for electrically coupling the through-die interconnects 170 and 172 with electrical connectors at a subsequent stage.

FIG. 2E illustrates one embodiment of the interconnects 170 and 172, but there are several other ways that the through-die interconnects can be connected to an interposer substrate or another die. For example, a backside redistribution structure could be formed on the backside surface of the substrate 205 and coupled to the through-die interconnects. Further, although recesses 225 are shown, the thinning process or a chemical etch can be used to offset the entire backside surface from the backside portions 229 of the interconnects 170 and 172.

Figure 2F:
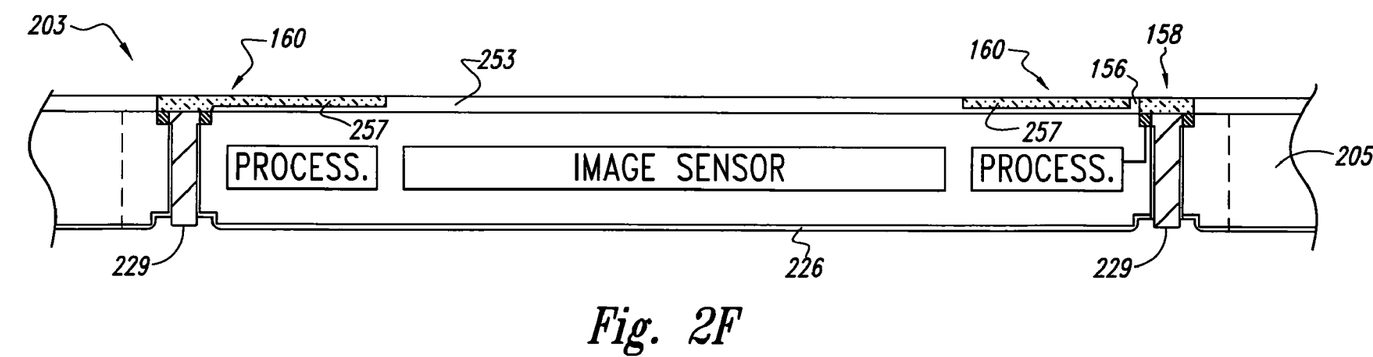

FIG. 2F is a cross-sectional side view of the workpiece 203 at a subsequent stage for forming the redistribution structure 150 and the EMI shield 160. This stage, for example, includes depositing and patterning an insulating layer 253 on a front side surface of the substrate 205 and then forming the traces 158 and the EMI shield 160 by depositing and patterning a metal layer 257 on the insulating layer 253. In this embodiment, the EMI shield 160 is a first portion of the metal layer 257 and the traces are a second portion of the metal layer electrically insulated from the first portion. For example, dielectric spacers 156 (only one shown) defined by a portion of the insulating layer 253 can electrically insulate the traces 158 from the EMI shield 160. In many embodiments, the insulating layer 253 may include a variety of nonconductive polymer, oxide materials, or other dielectric materials. For example, the insulating layer 253 can include polybenzoxazole (PBO) or other types of polymeric coatings that can be spun onto the workpiece 203. The traces 158 and the EMI shield 160 can include a variety of conductive materials, such as aluminum, copper, or aluminum-copper alloys. In addition, the traces 158 and the EMI shield 160 can also include various types of liner materials, such as titanium, tantalum, titanium nitride, or tantalum nitride.

Figure 2G:
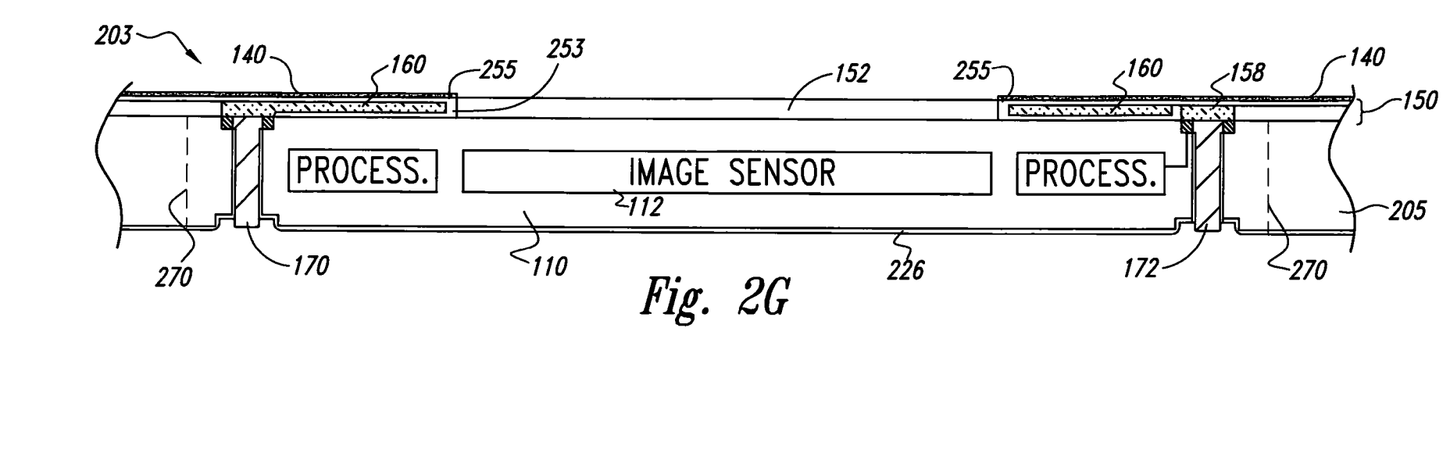

FIG. 2G is a cross-sectional side view of the workpiece 203 at a subsequent stage after (a) a dielectric layer 255 has been deposited on the insulating layer 253 and (b) the opening 152 has been formed through the dielectric layer 255 and the insulating layer 253. The opening 152 is configured to define a passageway through which radiation can pass to the image sensor 112. In many embodiments, after forming the redistribution structure 150, the die 110 can be singulated from the workpiece 203 by cutting the substrate 205 at substrate cutting lanes 270.

Figure 2H:
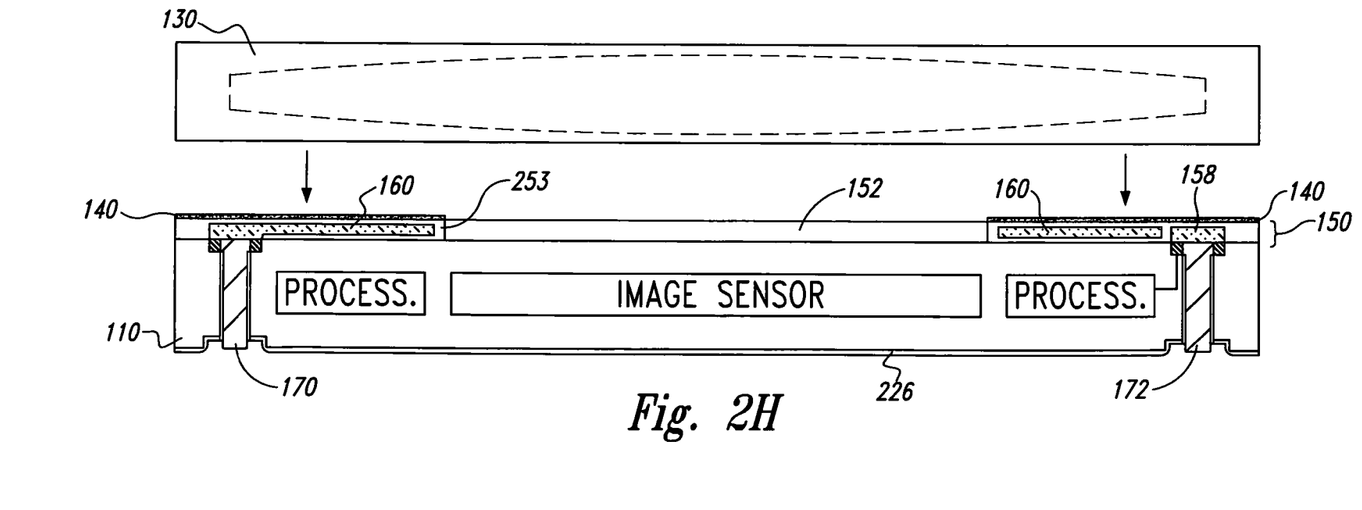

FIG. 2H is a partially exploded cross-sectional side view of the die 110 during a bonding process in which the optics assembly 130 is attached to the die 110. At this stage, the optics assembly 130 is aligned with the die 110, and the adhesive layer 140 is deposited on one of the optics assembly 130 or the die 110. The adhesive layer 140, for example, can be formed on the redistribution structure 150 such that the adhesive layer 140 does not cover the opening 152 as shown in FIG. 2H. In many embodiments, the adhesive layer 140 can include a variety of die attach films or pastes for adhering the optics assembly 130 to the die 110. After attaching the optics assembly 130, the exposed backside contact portions can be electrically coupled with the interposer substrate 190 (FIG. 2A).

Figure 3:
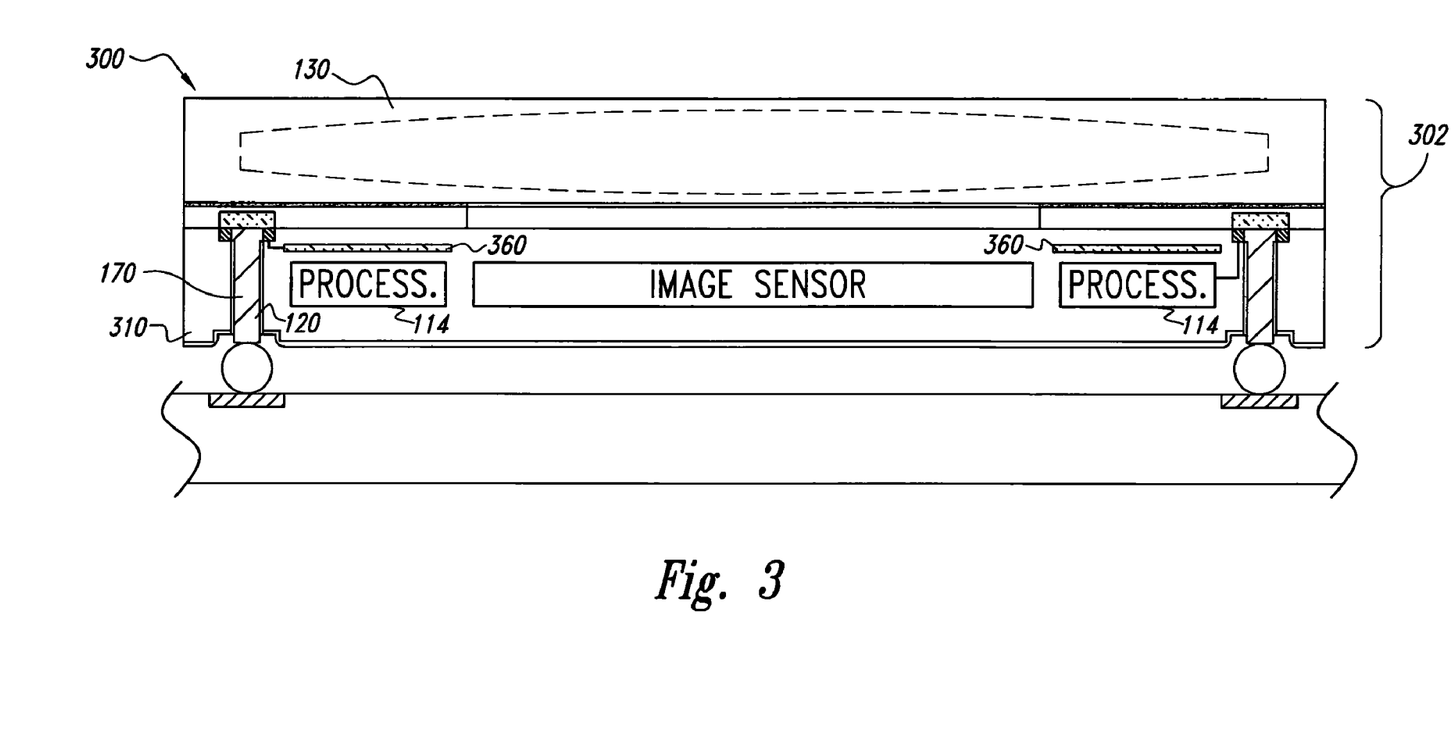
FIG. 3 is a cross-sectional side view schematically showing an imaging system configured in accordance with another embodiment of the disclosure.

In additional embodiments, microelectronic devices can include other types of EMI shields in addition to or in lieu of those that are formed in a redistribution structure. For example, FIG. 3 is a cross-sectional side view schematically showing an embodiment of an imaging system 300 having an imaging unit 302 that includes the optics assembly 130 and a microelectronic imaging die 310 with an EMI shield 360 formed in metallization layers of the die 310. The EMI shield 360 can be generally similar to the EMI shield 160. For example, the EMI shield 360 is positioned between the processing components 114 and the optics assembly 130, and the EMI shield 360 is electrically coupled to a backside of the die 310 via a first through-die interconnect 170. However, unlike the EMI shield 160, the EMI shield 360 is formed within the substrate at a Back End Of Line (BEOL) process before depositing and patterning a redistribution structure. The EMI shield 360, therefore, is between the processing components 114 and the substrate pads at the front side surface of the substrate.

Figure 4:
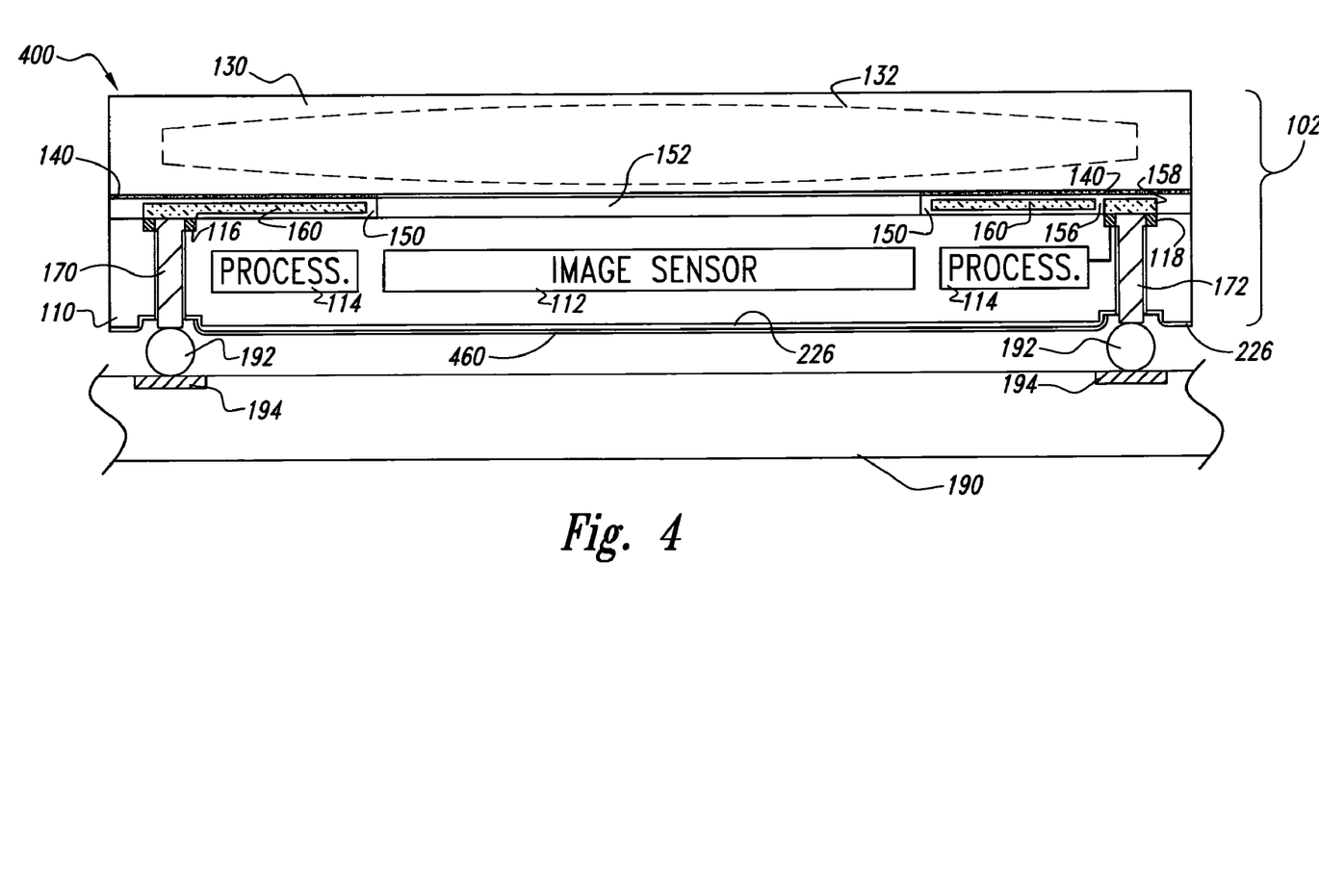
FIG. 4 is a cross-sectional side view schematically showing an imaging system configured in accordance with another embodiment of the disclosure.

FIG. 4 is a cross-sectional view schematically illustrating a system 400 in accordance with another embodiment of the disclosure. In the illustrated embodiment, the system 400 includes the EMI shield 160 and the redistribution structure 150 such that the EMI shield 160 is located between the processing components 114 and the optics assembly 130. The system 400 further includes a backside EMI shield 460 to shield the backside of the image sensor 112 and the processing components 114. The backside EMI shield 460 can be a metal layer deposited onto the backside dielectric layer 226. In an alternative embodiment (not shown), the backside EMI shield 460 can be formed directly on the backside surface of the die 110, and then the backside dielectric layer 226 can be deposited onto the backside EMI shield 460. The backside EMI shield 460 is electrically coupled to the first through-substrate interconnect 170, but the backside EMI shield 460 is not connected to the second through-substrate interconnects 172. The system 400 accordingly provides EMI shielding for radiation that approaches the processing components 114 from both the front side (e.g., the side with the optics assembly 130) and the backside of the die 110. The backside EMI shield 460 further provides backside EMI shielding for the image sensor 112.

Figure 5:
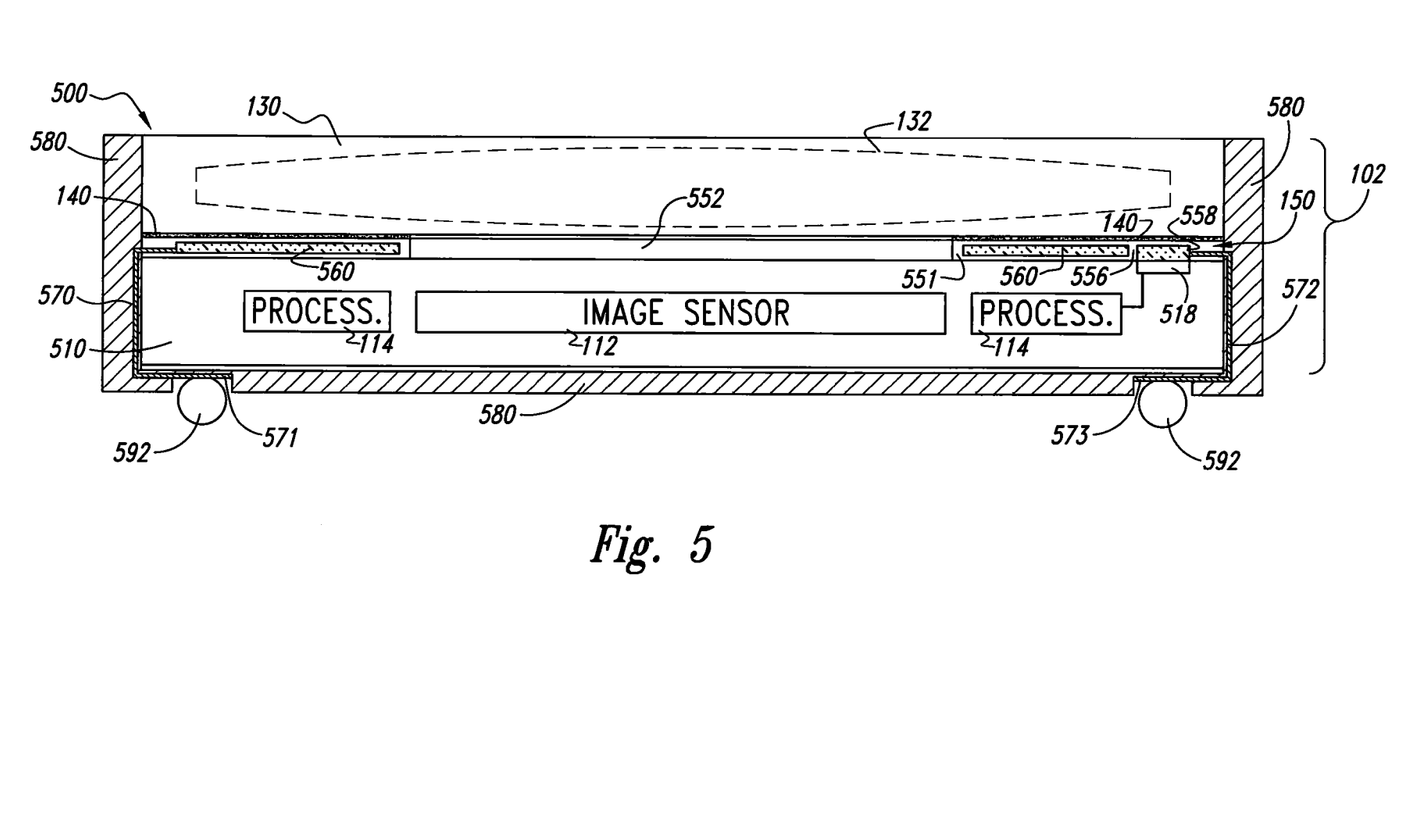
FIG. 5 is a cross-sectional side view schematically illustrating another imaging system in accordance with yet another embodiment of the disclosure.

FIG. 5 is a cross-sectional view schematically illustrating a system 500 in accordance with another embodiment of the disclosure. In this embodiment, the system 500 includes a die 510 having the image sensor 112 and the processing circuitry 114 as described above. The die 510, however, does not necessarily include the first and second through-substrate interconnects 170 and 172. Instead, the system 500 can further include a redistribution structure 550, an EMI shield 560, and first and second interconnects 570 and 572. The redistribution structure 550 can include a dielectric layer 551 having an opening 552 aligned with the image sensor 112. The redistribution structure 550 further include traces 558 coupled to substrate pads 518 that are electrically coupled the processing components 114. The system 500 can further include a casing 580 formed from a dielectric encapsulant, and the first and second interconnects 570 and 572 can be formed to extend through the casing 580. The first interconnect 570 is electrically coupled to the EMI shield 560 and can have a first terminal 571, and the second interconnect 572 is electrically coupled to one of the traces 558 and can have a second terminal 573. In practice, the system 500 includes a plurality of second interconnects 572 coupled to corresponding traces 558. The system can further include connectors 592, such as bumps or solder balls, attached to the first and second terminals 571 and 573. The EMI shield 560 of the system 500 is expected to operate in a manner similar to the EMI shield 160 illustrated and described above with reference to FIGS. 2A and 2B.

Figure 6:
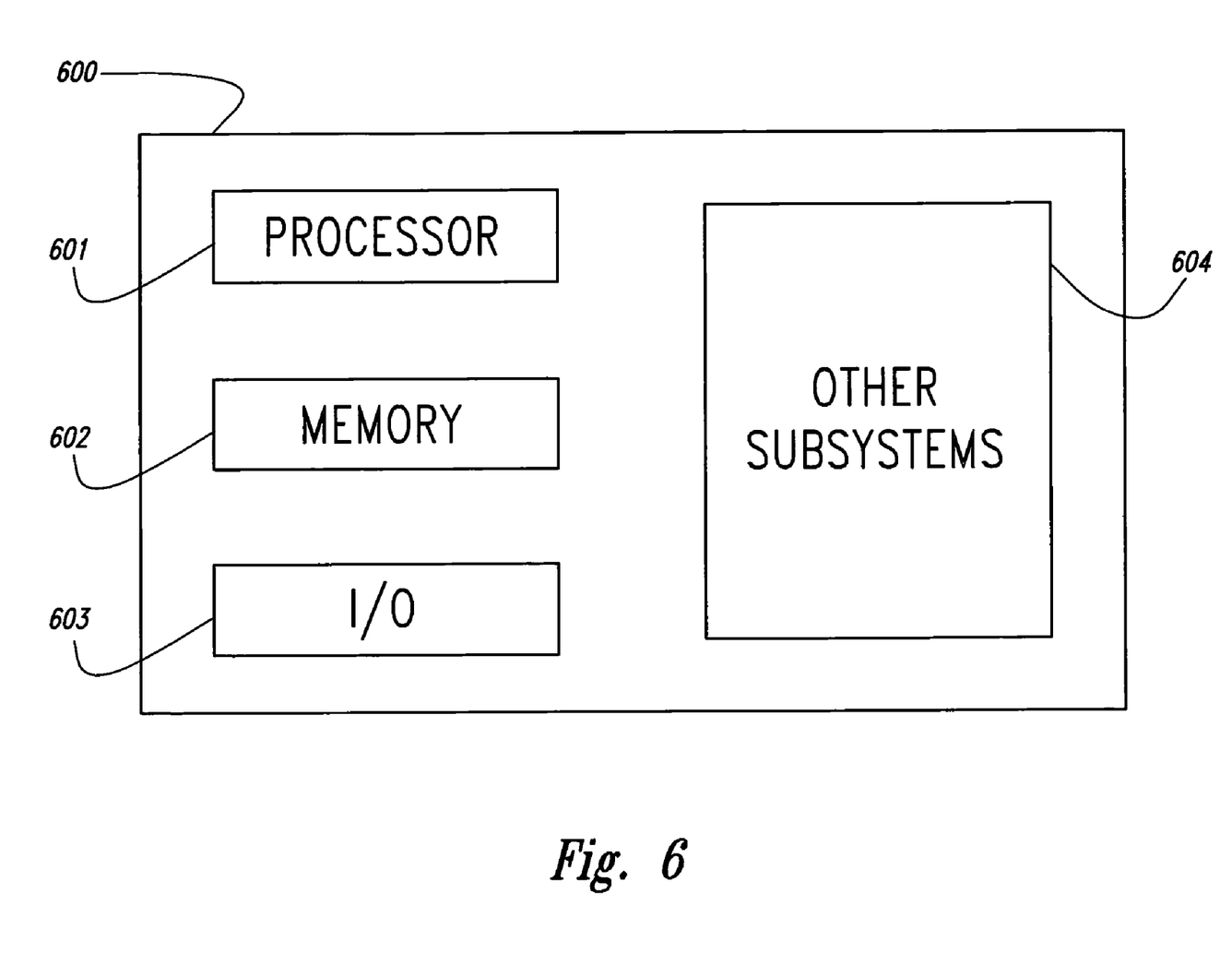
FIG. 6 is a schematic illustration of a system in which embodiments of microelectronic devices having EMI shields may be incorporated.

Any one of the microelectronic dies having EMI shields described above with reference to FIGS. 2A-5 can be incorporated into any of a myriad of larger or more complex systems 600 as shown schematically in FIG. 6. The system 600 can include a processor 601, a memory 602 (e.g., SRAM, DRAM, Flash, or other memory device), input/output devices 603, or other subsystems or components 604. Microelectronic devices may be included in any of the components shown in FIG. 6. The resulting system 600 can perform any of a wide variety of computing, processing, storage, sensor, imaging, or other functions. Accordingly, representative systems 600 include, without limitation, computers or other data processors, for example, desktop computers, laptop computers, Internet appliances, hand-held devices (e.g., palm-top computers, wearable computers, cellular or mobile phones, and personal digital assistants), multi-processor systems, processor-based or programmable consumer electronics, network computers, and minicomputers. Other representative systems 600 include cameras, light or other radiation sensors, servers and associated server subsystems, display devices, or memory devices. In such systems, individual dies can include imager arrays, such as CMOS imagers. Components of the system 600 may be housed in a single unit or distributed over multiple, interconnected units, e.g., through a communications network. Components can accordingly include local or remote memory storage devices and any of a wide variety of computer-readable media.

From the foregoing, it will be appreciated that specific embodiments have been described herein for purposes of illustration, but well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature or additional types of other features are not precluded. It will also be appreciated that specific embodiments have been described herein for purposes of illustration but that various modifications may be made within the claimed subject matter. For example, any of the foregoing embodiments described with respect to FIGS. 2A-6 can be used in combination with each other or in combination with any of the devices described in commonly owned U.S. patent application Ser. Nos. 12/057,762 and 12/058,244, both of which were filed on Mar. 28, 2008, and are incorporated by reference herein in their entirety. Furthermore, many of the elements of one embodiment can be combined with other embodiments in addition to, or in lieu of, the elements of the other embodiments. The backside EMI shield shown in FIG. 4, for example, can be used in combination with any of the systems shown in FIGS. 3 and 5 as well. Accordingly, the invention is not limited except as by the appended claims.

I claim:

1. An imaging system, comprising:
  a microelectronic die including:
    an image sensor,
    processing components electrically coupled to the image sensor,
    a semiconductor substrate,
    a dielectric layer on the substrate,
    a metal layer defining an electromagnetic interference (EMI) shield on the dielectric layer
    a first interconnect electrically isolated from the processing components, and
    a second interconnect electrically coupled to the processing components; and
  an optics assembly aligned with the image sensor, wherein the EMI shield is between the optics assembly and the processing components, and wherein the EMI shield is electrically coupled to the first interconnect.

2. The imaging system of claim 1 wherein:
the processing components are arranged around the image sensor such that the processing components have a first inner perimeter and a first outer perimeter;
the first interconnect comprises a first through-die interconnect and the second interconnect comprises a second through-die interconnect;
the EMI shield is electrically coupled to the first through-die interconnect and the EMI shield has a second inner perimeter and a second outer perimeter, and wherein the second inner perimeter and the second outer perimeter of the EMI shield are aligned with or extend beyond the first inner perimeter and the first outer perimeter, respectively, of the processing components.

3. The imaging system of claim 2, further comprising:
a front side redistribution structure at a front side of the die, wherein the front side redistribution structure includes an insulating layer, a metal layer having a first portion and a second portion electrically isolated from the first portion, and an opening aligned with the image sensor, and wherein the first portion of the metal layer defines the EMI shield electrically coupled to the first through-die interconnect and the second portion defines a trace electrically coupled to the second through-die interconnect.

4. The imaging system of claim 1, wherein the EMI shield comprises a metal layer within the die.

5. The imaging system of claim 1, further comprising a front side redistribution structure at a front side of the die, wherein the front side redistribution structure comprises a metal layer defining the EMI shield.

6. The imaging system of claim 5 wherein the front side redistribution structure comprises an opening aligned with the image sensor of the die.

7. The imaging system of claim 1 wherein the first interconnect comprises a first through-die interconnect and the second interconnect comprises a second through-die interconnect.

8. The imaging system of claim 1, further comprising a dielectric casing around a peripheral portion of the die, and wherein the first interconnect extends through the casing around one portion of the die and the second interconnect extends through the casing around another portion of the die.

9. The imaging system of claim 1 further comprising a backside EMI shield at a backside of the die, wherein the backside EMI shield is electrically coupled to the first interconnect.

10. An imaging unit, comprising:
a microelectronic die comprising:
a substrate including a front side, a backside, and a plurality of edges defining a perimeter of the substrate;
an image sensor carried by the substrate and configured to receive radiation at the front side;
one or more processing components carried by the substrate and electrically coupled to the image sensor; and
an electromagnetic interference (EMI) shield on and/or within the substrate, wherein the EMI shield has an outer perimeter not greater than the substrate perimeter and is configured to block radiation at the front side from reaching the processing components.

11. The imaging unit of claim 10, wherein the imaging unit is comprised with a system, and wherein the system comprises at least one of a processor and a memory device.

12. The imaging unit of claim 10 wherein:
the processing components occupy a first region of the substrate that at least partially surrounds the image sensor; and
the EMI shield occupies a second region superimposed with the first region.

13. The imaging unit of claim 12 wherein the EMI shield has an opening aligned with the image sensor such that EMI shield does not block radiation at the front side from the image sensor.

14. The imaging unit of claim 11, further comprising a first through-die interconnect electrically coupled to the EMI shield and a second through-die interconnect electrically coupled to the processing components.

15. The imaging unit of claim 11 wherein the EMI shield is a metal layer in a front side redistribution structure at the front side of the die.

16. The imaging unit of claim 11 wherein the EMI shield is a metal layer within the substrate.

17. A method of manufacturing a microelectronic imaging unit, comprising
forming an microelectronic die comprising a electromagnetic interference (EMI) shield such the EMI shield is electrically isolated from processing components that are electrically coupled to an image sensor of the die, the processing components being located at a first region within the die, wherein the first region comprises a first perimeter, and wherein the metal layer has a second perimeter that is aligned with and/or outside of the first perimeter; and
coupling an optics assembly to the die after forming the EMI shield, and wherein the EMI shield is between the optics assembly and the processing components.

18. The method of claim 17 wherein the processing components and the image sensor are formed in a substrate having a front side surface, and wherein forming the EMI shield comprises forming a metal layer in the die such that the metal layer is between at least selected features of the processing components and substrate pads at the front side surface of the substrate.

19. The method of claim 18, further comprising forming first through-die interconnects electrically coupled to the EMI shield but electrically insulated from the processing components and forming second through-die interconnects electrically coupled to the processing components but electrically insulated from the EMI shield.

20. The method of claim 17 wherein the processing components and the image sensor are formed in a substrate having a front side surface, and wherein forming the EMI shield comprises forming a metal layer in a redistribution structure located on the front side surface of the substrate such that the metal layer has a first portion superimposed with at least selected features of the processing components.

21. The method of claim 20 wherein the metal layer formed in the redistribution structure has a second portion electrically coupled to the processing components.

22. The method of claim 20, further comprising forming first through-die interconnects electrically coupled to the first portion of the metal layer shield but electrically insulated from the processing components and forming second through-die interconnects electrically coupled to the second portion of the metal layer but electrically insulated from the EMI shield.

* * * * *